United States Patent
Wang et al.

(10) Patent No.: US 12,161,050 B2
(45) Date of Patent: Dec. 3, 2024

(54) HIGH DENSITY MAGNETORESISTIVE RANDOM ACCESS MEMORY DEVICE

(71) Applicant: UNITED MICROELECTRONICS CORP., Hsin-Chu (TW)

(72) Inventors: Hui-Lin Wang, Taipei (TW); Ching-Hua Hsu, Kaohsiung (TW); Chen-Yi Weng, New Taipei (TW); Jing-Yin Jhang, Tainan (TW); Po-Kai Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 297 days.

(21) Appl. No.: 17/944,242

(22) Filed: Sep. 14, 2022

(65) Prior Publication Data
US 2024/0065108 A1 Feb. 22, 2024

(30) Foreign Application Priority Data
Aug. 17, 2022 (CN) .......................... 202210985756.0

(51) Int. Cl.
| | |
|---|---|
| *H10N 50/01* | (2023.01) |
| *G11C 11/16* | (2006.01) |
| *H10B 61/00* | (2023.01) |
| *H10N 50/10* | (2023.01) |
| *H10N 50/80* | (2023.01) |
| *H10N 50/85* | (2023.01) |

(52) U.S. Cl.
CPC .......... *H10N 50/01* (2023.02); *G11C 11/161* (2013.01); *H10B 61/00* (2023.02); *H10N 50/10* (2023.02); *H10N 50/80* (2023.02); *H10N 50/85* (2023.02)

(58) Field of Classification Search
CPC ........ H10N 50/01; H10N 50/85; H10N 50/10; H10B 61/00; G11C 11/161
See application file for complete search history.

(56) References Cited

U.S. PATENT DOCUMENTS

| | | | |
|---|---|---|---|
| 2020/0395535 A1* | 12/2020 | Liao | H01F 41/34 |
| 2021/0272896 A1* | 9/2021 | Lin | H01L 23/528 |
| 2022/0093684 A1* | 3/2022 | Chuang | H10N 50/80 |
| 2023/0061143 A1* | 3/2023 | Chen | H10N 50/80 |

OTHER PUBLICATIONS

Wang, the specification, including the claims, and drawings in the U.S. Appl. No. 17/673,760, filed Feb. 16, 2022.
Hsu, the specification, including the claims, and drawings in the U.S. Appl. No. 17/202,296, filed Mar. 15, 2021.

* cited by examiner

*Primary Examiner* — Scott Bauer
(74) *Attorney, Agent, or Firm* — Winston Hsu

(57) ABSTRACT

The high-density MRAM device of the present invention has a second interlayer dielectric (ILD) layer covering the capping layer in the MRAM cell array area and the logic area. The thickness of the second ILD layer in the MRAM cell array area is greater than that in the logic area. The composition of the second ILD layer in the logic area is different from the composition of the second ILD layer in the MRAM cell array area.

23 Claims, 5 Drawing Sheets

HIGH DENSITY MAGNETORESISTIVE RANDOM ACCESS MEMORY DEVICE

BACKGROUND OF THE INVENTION

1. Field of the Invention

The present invention relates to the field of semiconductor technology, and in particular, to a high-density magnetoresistive random access memory (MRAM) device and a manufacturing method thereof.

2. Description of the Prior Art

In a high-density magnetoresistive random access memory (MRAM) layout, a dummy magnetic tunnel junction (MTJ) pattern is provided on the word line strap of the MRAM cell array area. When forming the second via (V2) layer, different dielectric film structures need to be etched in the MRAM cell array area and logic area, respectively. Vias with negative slope profiles may be formed, resulting in poor step coverage in the subsequent Ta/TaN barrier layer and copper seed layer deposition processes. In some cases, undesired Cu void defects are formed.

SUMMARY OF THE INVENTION

It is one object of the present invention to provide an improved magnetoresistive random access memory device and a manufacturing method thereof to solve the above-mentioned deficiencies or shortcomings of the prior art.

One aspect of the invention provides a high-density magnetoresistive random access memory (MRAM) device including a substrate having a MRAM cell array area and a logic area; a first interlayer dielectric (ILD) layer disposed on the substrate within the MRAM cell array area and the logic area; a first metal pad and a second metal pad disposed in the first ILD layer within the MRAM cell array area and the logic area, respectively; a capping layer covering the first metal pad, the second metal pad, and the first ILD layer within the MRAM cell array area and the logic area; and a second interlayer dielectric (ILD) layer covering the capping layer within the MRAM cell array area and the logic area.

The second ILD has a thickness in the MRAM cell array area greater than a thickness in the logic area. The first thickness is greater than the second thickness. A composition of the second ILD layer in the logic area is different from a composition of the second ILD layer in the MRAM cell array area.

A magnetic tunnel junction (MTJ) structure is disposed on the second ILD layer within the MRAM cell array area. A protective layer is disposed to conformally cover the MTJ structure and the second ILD layer within the MRAM cell array area. A third interlayer dielectric (ILD) layer is disposed to cover the protective layer within the MRAM cell array area. A fourth interlayer dielectric (ILD) layer is disposed to cover the third ILD layer within the MRAM cell array area and the second ILD layer within the logic area.

According to some embodiments, the MTJ structure is a dummy MTJ structure.

According to some embodiments, the high-density MRAM device further comprises: a local interconnect structure disposed on the dummy MTJ structure, wherein the local interconnect structure comprises a metal layer on the MTJ structure and a via layer electrically connecting the metal layer to the first metal pad.

According to some embodiments, the dummy MTJ structure comprises a top electrode and bottom electrode, wherein the top electrode is in direct contact with the metal layer, and the bottom electrode is not directly connected with the first metal pad.

According to some embodiments, the high-density MRAM device further comprises: an interconnect structure electrically connected to the second metal pad, wherein the interconnect structure penetrates through the fourth ILD layer, the second ILD layer, and the capping layer.

According to some embodiments, the first metal pad is a word line strap.

According to some embodiments, the first ILD layer and the fourth ILD layer are ultra-low dielectric constant (ULK) layers.

According to some embodiments, the second ILD layer and the third ILD layer are silicon oxide layers.

According to some embodiments, the second ILD layer in the logic area has a nitrogen doping concentration that is higher than that of the second ILD layer in the MRAM cell array area.

According to some embodiments, the second ILD layer in the logic area has a gradient nitrogen doping concentration across its entire thickness.

According to some embodiments, the second ILD layer in the logic area has a uniform nitrogen doping concentration across its entire thickness.

According to some embodiments, the capping layer comprises a nitrogen-doped silicon carbide (NDC) layer.

According to some embodiments, the protective layer comprises a silicon nitride layer.

Another aspect of the invention provides a method for fabricating a high-density magnetoresistive random access memory (MRAM) device. A substrate having a MRAM cell array area and a logic area is provided. A first interlayer dielectric (ILD) layer is formed on the substrate within the MRAM cell array area and the logic area. A first metal pad and a second metal pad are formed in the first ILD layer within the MRAM cell array area and the logic area, respectively. A capping layer is formed to cover the first metal pad, the second metal pad, and the first ILD layer within the MRAM cell array area and the logic area. A second interlayer dielectric (ILD) layer is formed to cover the capping layer within the MRAM cell array area and the logic area. A magnetic tunnel junction (MTJ) structure is formed on the second ILD layer within the MRAM cell array area. A protective layer is formed to conformally cover the MTJ structure and the second ILD layer. A third interlayer dielectric (ILD) layer is formed to cover the protective layer. The third ILD layer, the protective layer, and the second ILD layer within the logic area are etched. The second ILD layer within the logic area is doped with dopants containing nitrogen. A fourth interlayer dielectric (ILD) layer is formed to cover the third ILD layer within the MRAM cell array area and the second ILD layer within the logic area.

According to some embodiments, the MTJ structure is a dummy MTJ structure.

According to some embodiments, the method further includes the step of forming a local interconnect structure on the dummy MTJ structure, wherein the local interconnect structure comprises a metal layer on the MTJ structure and a via layer electrically connecting the metal layer to the first metal pad.

According to some embodiments, the dummy MTJ structure comprises a top electrode and bottom electrode, wherein the top electrode is in direct contact with the metal layer, and the bottom electrode is not directly connected with the first metal pad.

According to some embodiments, the method further includes the step of forming an interconnect structure electrically connected to the second metal pad, wherein the interconnect structure penetrates through the fourth ILD layer, the second ILD layer, and the capping layer.

According to some embodiments, the first ILD layer and the fourth ILD layer are ultra-low dielectric constant (ULK) layers.

According to some embodiments, the second ILD layer and the third ILD layer are silicon oxide layers.

According to some embodiments, the second ILD layer in the logic area has a nitrogen doping concentration that is higher than that of the second ILD layer in the MRAM cell array area.

According to some embodiments, the capping layer comprises a nitrogen-doped silicon carbide (NDC) layer.

According to some embodiments, the protective layer comprises a silicon nitride layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
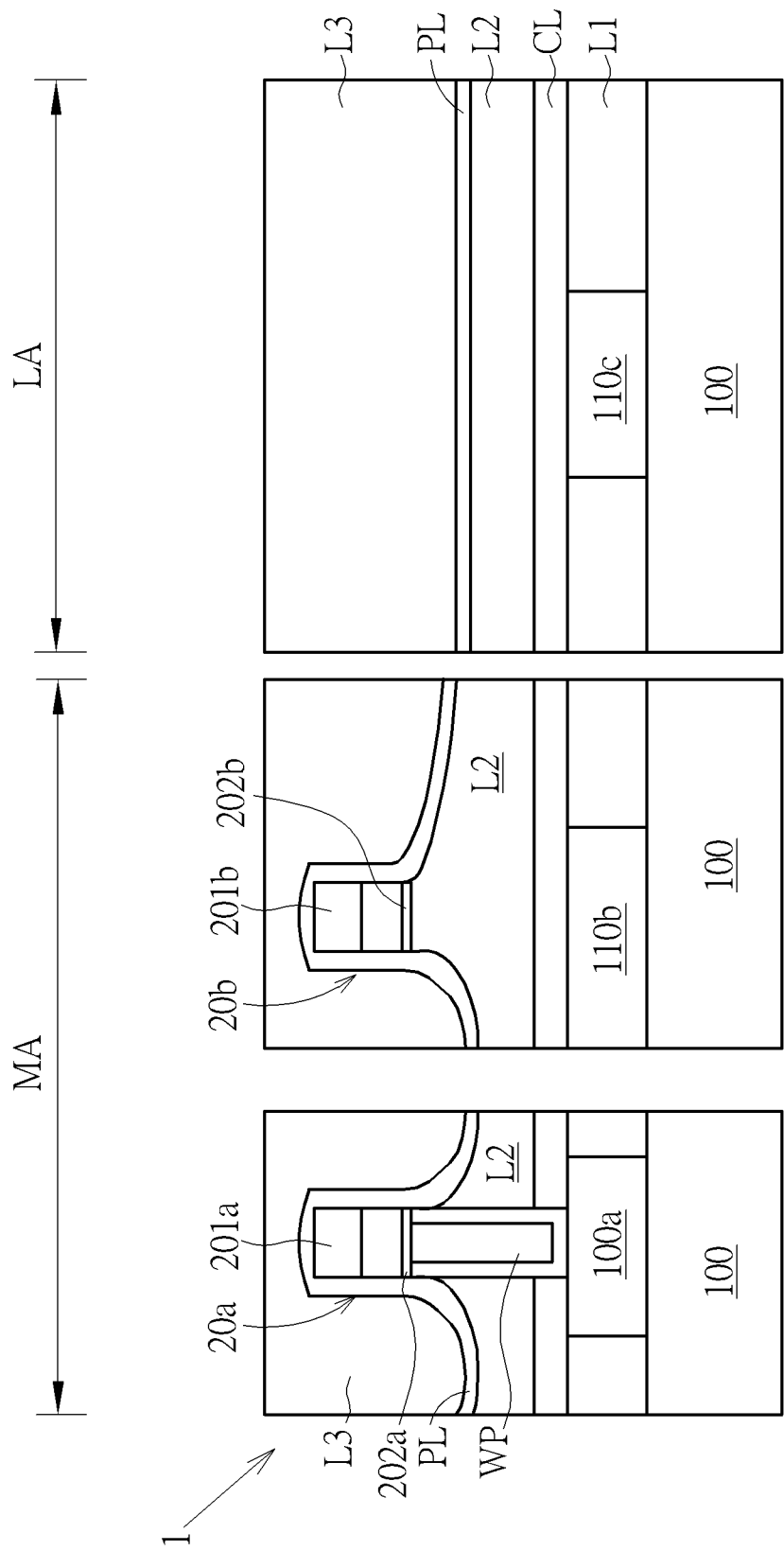
FIG. 1 to FIG. 5 are schematic diagrams illustrating a method for fabricating a high-density MRAM device according to an embodiment of the present invention.

Please refer to FIG. 1 to FIG. 5, which are schematic diagrams showing a method for manufacturing a high-density magnetoresistive random access memory (MRAM) device 1 according to an embodiment of the present invention. As shown in FIG. 1, a substrate 100, for example, a semiconductor substrate is first provided. According to an embodiment of the present invention, the substrate 100 has an MRAM cell array area MA and a logic area LA. According to an embodiment of the present invention, an interlayer dielectric (ILD) layer L1 is formed on the substrate 100 in the MRAM cell array area MA and the logic area LA. For example, the ILD layer L1 may be an ultra-low dielectric constant (ULK) layer. According to an embodiment of the present invention, subsequently, metal pads 110a-110c are formed in the ILD layer L1 in the MRAM cell array area MA and the logic area LA, respectively. For example, the metal pads 110a-110c may be copper pads in the second metal layer (M2) formed by using a copper damascene process.

According to an embodiment of the present invention, the metal pad 110b is a word line strap.

According to an embodiment of the present invention, next, a capping layer CL covering the metal pads 110a-110c and the ILD layer L1 is formed in the MRAM cell array area MA and the logic area LA. According to an embodiment of the present invention, for example, the capping layer CL may include a nitrogen-doped silicon carbide (NDC) layer, but is not limited thereto. Subsequently, an interlayer dielectric (ILD) layer L2 covering the capping layer CL is formed in the MRAM cell array area MA and the logic area LA. For example, the ILD layer L2 may be a tetraethoxysilane (TEOS) silicon oxide layer.

Subsequently, according to an embodiment of the present invention, magnetic tunnel junction (MTJ) structures 20a and 20b are formed on the ILD layer L2 in the MRAM cell array area MA. According to an embodiment of the present invention, the MTJ structures 20a and 20b are respectively located over the metal pads 110a and 110b buried in the interlayer dielectric layer ILL According to an embodiment of the present invention, the MTJ structure 20a includes an upper electrode 201a and a lower electrode 202a, wherein the lower electrode 202a is directly electrically connected to the metal pad 110a through the tungsten plug WP. The MTJ structure 20b also includes an upper electrode 201b and a lower electrode 202b, but the MTJ structure 20b is a dummy MTJ structure, so there is no tungsten plug between the lower electrode 202b and the metal pad 110b. That is, the lower electrode 202 is not directly connected or disconnected to the metal pad 110b.

According to an embodiment of the present invention, next, a protective layer PL is blanket deposited to conformally cover the MTJ structures 20a and 20b and the ILD layer L2. According to an embodiment of the present invention, for example, the protective layer PL may include a silicon nitride layer. According to an embodiment of the present invention, the protective layer PL may protect the sidewalls of the MTJ structures 20a and 20b. Subsequently, an interlayer dielectric (ILD) layer L3 covering the protective layer PL is formed. According to an embodiment of the present invention, the ILD layer L3 may be a silicon oxide layer. The ILD layer L3 may be subjected to a planarization process.

Figure 2:
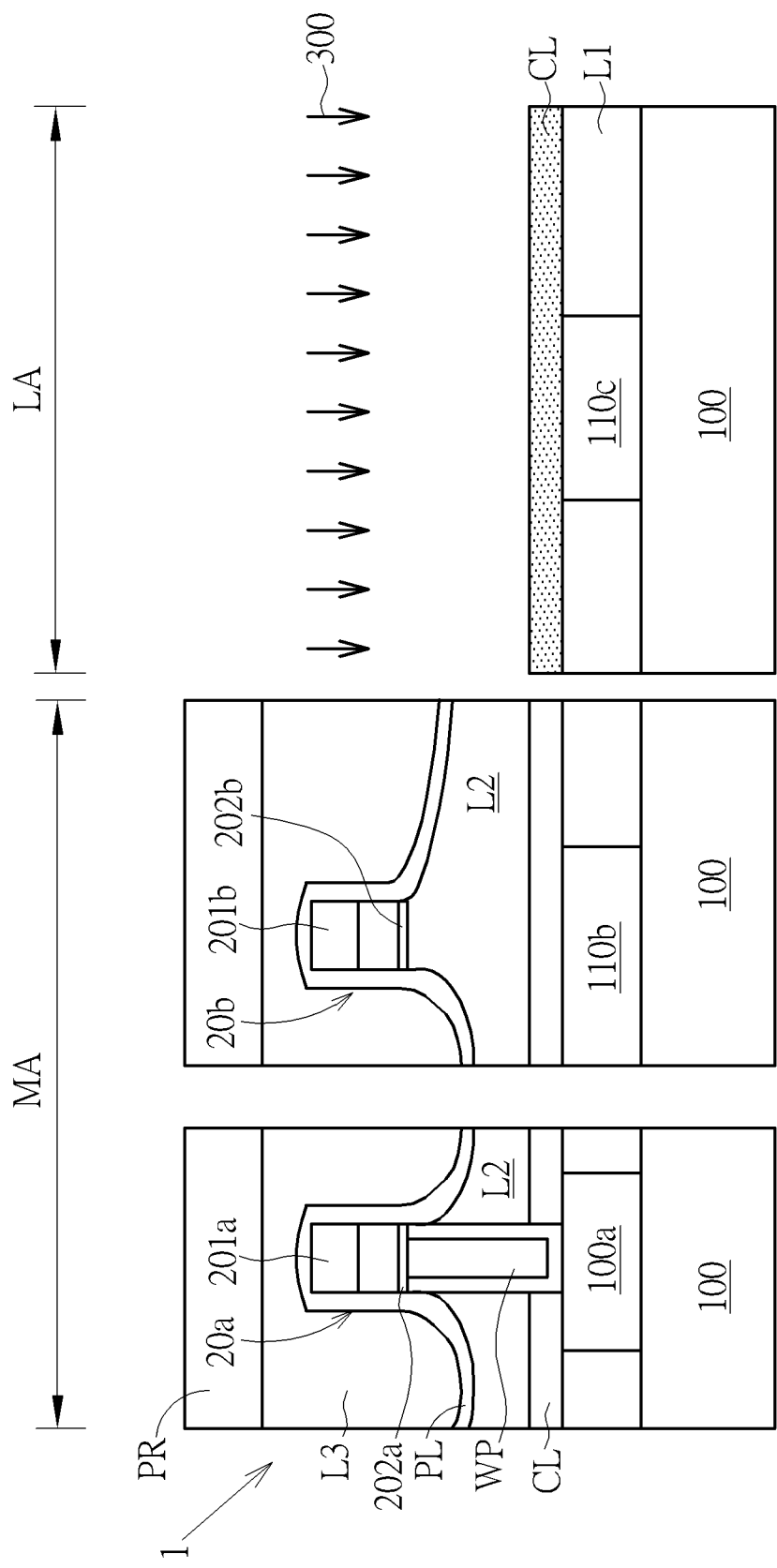

According to an embodiment of the present invention, as shown in FIG. 2, next, a photoresist pattern PR is formed on the ILD layer L3, so that the photoresist pattern PR covers the MRAM cell array area MA, but exposes the ILD layer L3 in the logic area LA. Next, the ILD layer L3, the protective layer PL and part of the ILD layer L2 in the logic area LA are etched. According to an embodiment of the present invention, at this point, the thickness of the ILD layer L2 in the MRAM cell array area MA is greater than that in the logic area LA.

According to an embodiment of the present invention, next, an ion implantation process 300 is performed, and the ILD layer L2 in the logic area LA is doped with nitrogen-containing dopants, such as $N_2$ and $NH_3$, so that the composition of the ILD layer L2 in the logic area LA is different from the composition of the ILD layer L2 in the MRAM cell array area MA. According to an embodiment of the present invention, the nitrogen doping concentration of the ILD layer L2 in the logic area LA is higher than the nitrogen doping concentration of the ILD layer L2 in the MRAM cell array area MA.

According to an embodiment of the present invention, after being modified by the ion implantation process 300, the ILD layer L2 in the logic area LA is transformed into a nitrogen-doped silicon oxide layer, and the etching rate of the ILD layer L2 in the logic area LA during the subsequent V2 via etching process can be reduced. According to an embodiment of the present invention, for example, the ILD layer L2 in the logic area LA has a gradient nitrogen doping concentration throughout its entire thickness. According to another embodiment of the present invention, for example, the ILD layer L2 in the logic area LA has a uniform nitrogen doping concentration throughout its entire thickness.

Figure 3:
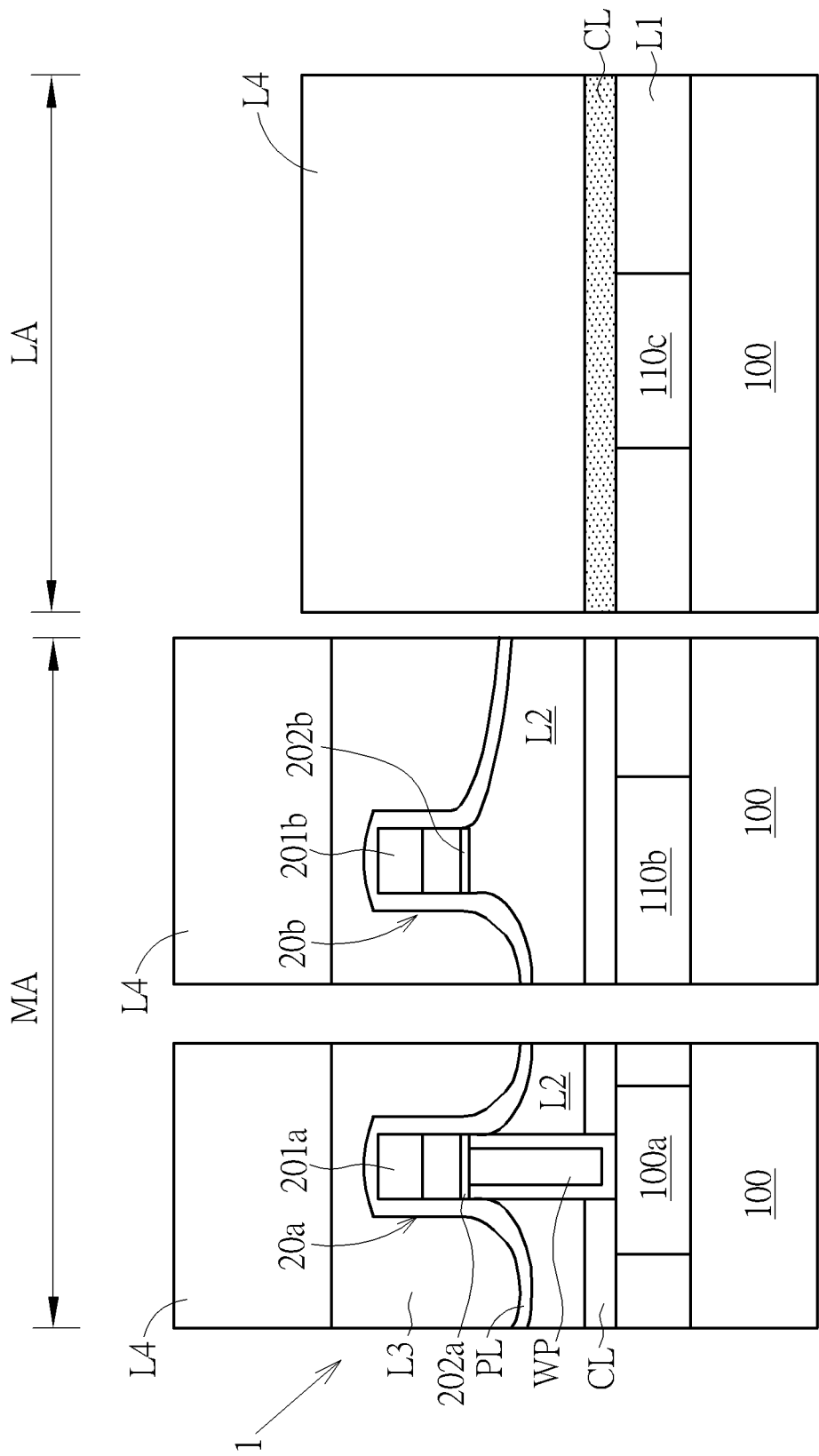

According to an embodiment of the present invention, as shown in FIG. 3, next, an interlayer dielectric (ILD) layer L4 is blanket deposited to cover the ILD layer L3 in the MRAM cell array area MA and the ILD layer L2 in the logic area LA. According to an embodiment of the present invention, for example, the ILD layer L4 is an ultra-low dielectric constant (ULK) layer.

Figure 4:
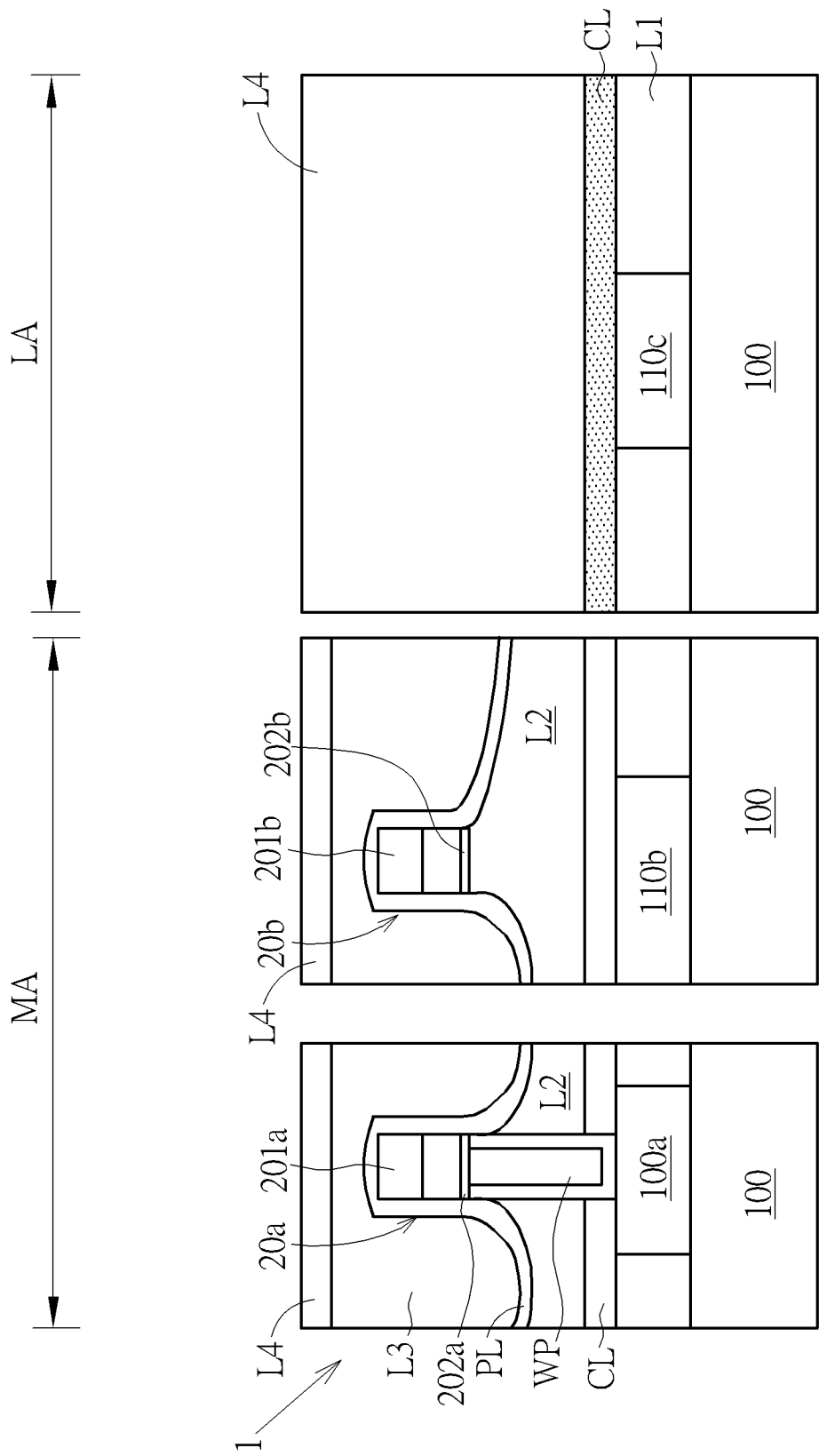

According to an embodiment of the present invention, as shown in FIG. 4, next, the ILD layer L4 is subjected to a planarization process, for example, a chemical mechanical polishing (CMP) process. According to an embodiment of the present invention, after the planarization process is completed, a partial thickness of the ILD layer L4 may be remained over the ILD layer L3 in the MRAM cell array area MA.

Figure 5:
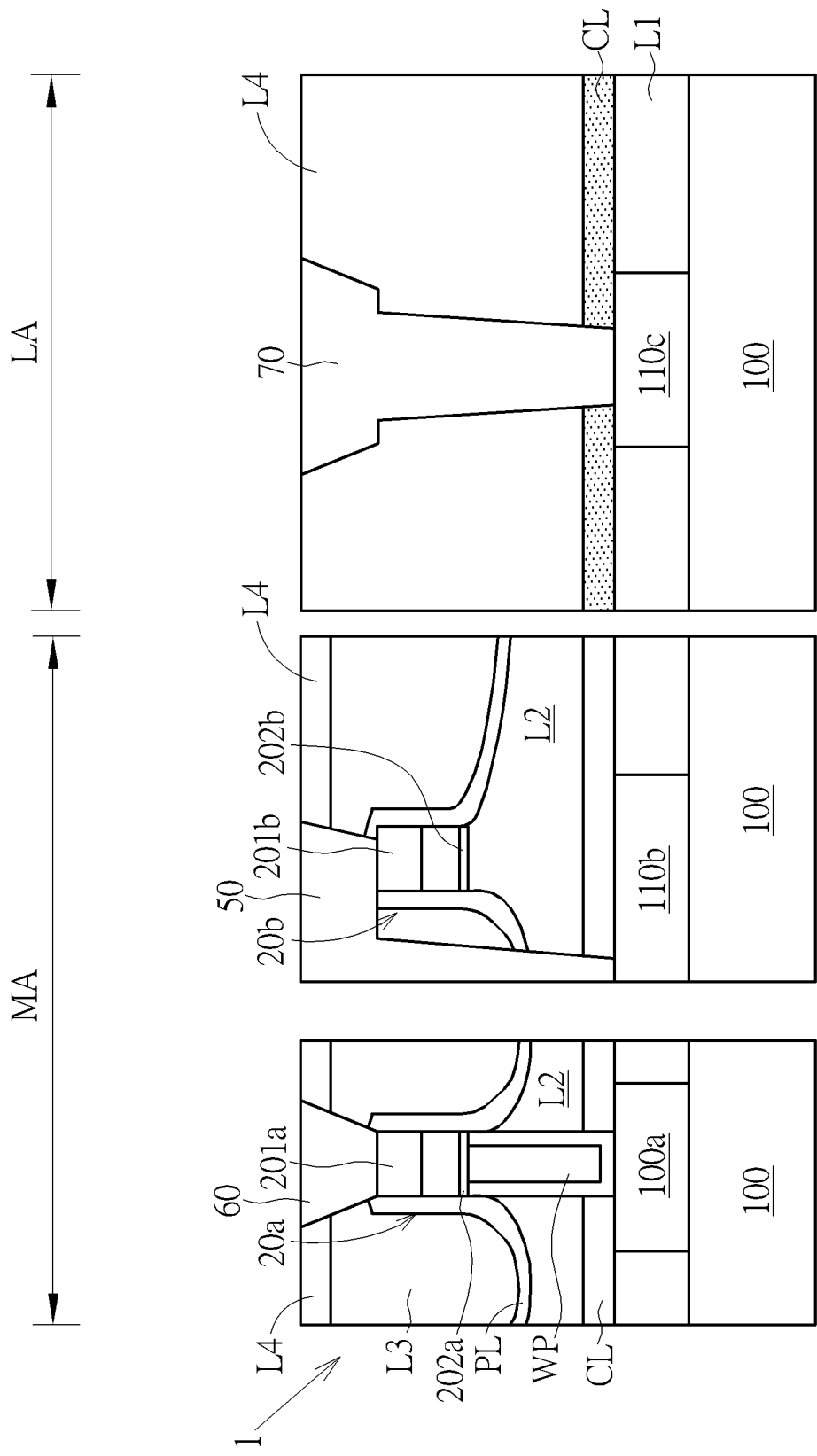

Finally, as shown in FIG. 5, a local interconnect structure 50 is formed on the dummy MTJ structure 20b in the MRAM cell array area MA. The local interconnect structure 50 includes an M3 metal layer 501 on the dummy MTJ structure 20b and a V2 via layer 502 electrical connecting the M3 metal layer 501 to the metal pad 110b. At the same time, a contact structure 60 is formed on the MTJ structure 20a in the MRAM cell array area MA, and an interconnection structure 70 is formed in the logic area LA. The interconnect structure 70 is electrically connected to the metal pad 110c. The interconnect structure 70 penetrates through the ILD layer L4, the ILD layer L2 and the capping layer CL.

Structurally, as shown in FIG. 5, the high-density MRAM device 1 of the present invention includes: substrate 100 comprising MRAM cell array area MA and logic area LA; ILD layer L1 covering the MRAM cell array area MA and the logic area LA on the substrate 100; metal pads 110a-110c respectively arranged in the ILD layer L1 in the MRAM cell array area MA and the logic area LA; capping layer CL covering the metal pads 110a-110c in the MRAM cell array area MA and the logic area LA and the ILD layer L1; and ILD layer L2 covering the MRAM cell array area MA and the capping layer CL in the logic area LA, wherein the thickness of the ILD layer L2 in the MRAM cell array area MA is greater than that in the logic area LA. The composition of the ILD layer L2 in the logic area LA is different from the composition of the ILD layer L2 in the MRAM cell array area MA. The magnetic tunnel junction (MTJ) structures 20a and 20b are arranged on the ILD layer L2 in the MRAM cell array area MA. The protective layer PL conformally covers the MTJ structures 20a and 20b and the ILD layer L2 in the MRAM cell array area MA. The ILD layer L3 covers the protective layer PL in the MRAM cell array area MA. The ILD layer L4 covers the ILD layer L3 within the MRAM cell array area MA and the ILD layer L2 within the logical area LA.

According to an embodiment of the present invention, the MTJ structure 20b is a dummy MTJ structure. The high-density MRAM device 1 further includes a local interconnect structure 50 disposed on the dummy MTJ structure 20b. The local interconnect structure 50 includes a metal layer 501 located on the dummy MTJ structure 20b and a via layer 502 electrically connecting the metal layer 501 to the metal pad 110b. The dummy MTJ structure 20b includes an upper electrode 201b and a lower electrode 202b. The upper electrode 201b is in direct contact with the metal layer 501, and the lower electrode 202b is not directly connected with the metal pad 110b.

According to an embodiment of the present invention, the high-density MRAM device 1 further includes an interconnection structure 70 electrically connected to the metal pad 110c. The interconnection structure 70 penetrates through the ILD layer L4, the ILD layer L2 and the capping layer CL. According to an embodiment of the present invention, metal pad 110c is a word line strap.

According to an embodiment of the present invention, the ILD layer L1 and the ILD layer L4 are ultra-low dielectric constant (ULK) layers. According to an embodiment of the present invention, the ILD layer L2 and the ILD layer L3 are silicon oxide layers.

According to an embodiment of the present invention, the nitrogen doping concentration of the ILD layer L2 in the logic area LA is higher than the nitrogen doping concentration of the ILD layer L2 in the MRAM cell array area MA. According to an embodiment of the present invention, the ILD layer L2 in the logic area LA has a gradient nitrogen doping concentration throughout its thickness. According to another embodiment of the present invention, the ILD layer L2 in the logic area LA has a uniform nitrogen doping concentration throughout its thickness.

According to an embodiment of the present invention, the capping layer CL includes a nitrogen-doped silicon carbide (NDC) layer. According to an embodiment of the present invention, the protective layer PL includes a silicon nitride layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-density magnetoresistive random access memory (MRAM) device, comprising:
   a substrate having a MRAM cell array area and a logic area;
   a first interlayer dielectric (ILD) layer disposed on the substrate within the MRAM cell array area and the logic area;
   a first metal pad and a second metal pad disposed in the first ILD layer within the MRAM cell array area and the logic area, respectively;
   a capping layer covering the first metal pad, the second metal pad, and the first ILD layer within the MRAM cell array area and the logic area;
   a second interlayer dielectric (ILD) layer covering the capping layer within the MRAM cell array area and the logic area, wherein the second ILD has a thickness in the MRAM cell array area greater than a thickness in the logic area, wherein the first thickness is greater than the second thickness, and wherein a composition of the second ILD layer in the logic area is different from a composition of the second ILD layer in the MRAM cell array area;
   a magnetic tunnel junction (MTJ) structure disposed on the second ILD layer within the MRAM cell array area;
   a protective layer conformally covering the MTJ structure and the second ILD layer within the MRAM cell array area;

a third interlayer dielectric (ILD) layer covering the protective layer within the MRAM cell array area; and a fourth interlayer dielectric (ILD) layer covering the third ILD layer within the MRAM cell array area and the second ILD layer within the logic area.

2. The high-density MRAM device according to claim 1, wherein the MTJ structure is a dummy MTJ structure.

3. The high-density MRAM device according to claim 2 further comprising:

a local interconnect structure disposed on the dummy MTJ structure, wherein the local interconnect structure comprises a metal layer on the MTJ structure and a via layer electrically connecting the metal layer to the first metal pad.

4. The high-density MRAM device according to claim 3, wherein the dummy MTJ structure comprises a top electrode and bottom electrode, wherein the top electrode is in direct contact with the metal layer, and the bottom electrode is not directly connected with the first metal pad.

5. The high-density MRAM device according to claim 1 further comprising:

an interconnect structure electrically connected to the second metal pad, wherein the interconnect structure penetrates through the fourth ILD layer, the second ILD layer, and the capping layer.

6. The high-density MRAM device according to claim 1, wherein the first metal pad is a word line strap.

7. The high-density MRAM device according to claim 1, wherein the first ILD layer and the fourth ILD layer are ultra-low dielectric constant (ULK) layers.

8. The high-density MRAM device according to claim 1, wherein the second ILD layer and the third ILD layer are silicon oxide layers.

9. The high-density MRAM device according to claim 1, wherein the second ILD layer in the logic area has a nitrogen doping concentration that is higher than that of the second ILD layer in the MRAM cell array area.

10. The high-density MRAM device according to claim 1, wherein the second ILD layer in the logic area has a gradient nitrogen doping concentration across its entire thickness.

11. The high-density MRAM device according to claim 1, wherein the second ILD layer in the logic area has a uniform nitrogen doping concentration across its entire thickness.

12. The high-density MRAM device according to claim 1, wherein the capping layer comprises a nitrogen-doped silicon carbide (NDC) layer.

13. The high-density MRAM device according to claim 1, wherein the protective layer comprises a silicon nitride layer.

14. A method for fabricating a high-density magnetoresistive random access memory (MRAM) device, comprising:

providing a substrate having a MRAM cell array area and a logic area;

forming a first interlayer dielectric (ILD) layer on the substrate within the MRAM cell array area and the logic area;

forming a first metal pad and a second metal pad in the first ILD layer within the MRAM cell array area and the logic area, respectively;

forming a capping layer covering the first metal pad, the second metal pad, and the first ILD layer within the MRAM cell array area and the logic area;

forming a second interlayer dielectric (ILD) layer covering the capping layer within the MRAM cell array area and the logic area;

forming a magnetic tunnel junction (MTJ) structure on the second ILD layer within the MRAM cell array area;

forming a protective layer conformally covering the MTJ structure and the second ILD layer;

forming a third interlayer dielectric (ILD) layer covering the protective layer;

etching the third ILD layer, the protective layer, and the second ILD layer within the logic area;

doping the second ILD layer within the logic area with dopants containing nitrogen; and forming a fourth interlayer dielectric (ILD) layer covering the third ILD layer within the MRAM cell array area and the second ILD layer within the logic area.

15. The method according to claim 14, wherein the MTJ structure is a dummy MTJ structure.

16. The method according to claim 15 further comprising:

forming a local interconnect structure on the dummy MTJ structure, wherein the local interconnect structure comprises a metal layer on the MTJ structure and a via layer electrically connecting the metal layer to the first metal pad.

17. The method according to claim 16, wherein the dummy MTJ structure comprises a top electrode and bottom electrode, wherein the top electrode is in direct contact with the metal layer, and the bottom electrode is not directly connected with the first metal pad.

18. The method according to claim 14 further comprising:

forming an interconnect structure electrically connected to the second metal pad, wherein the interconnect structure penetrates through the fourth ILD layer, the second ILD layer, and the capping layer.

19. The method according to claim 14, wherein the first ILD layer and the fourth ILD layer are ultra-low dielectric constant (ULK) layers.

20. The method according to claim 14, wherein the second ILD layer and the third ILD layer are silicon oxide layers.

21. The method according to claim 14, wherein the second ILD layer in the logic area has a nitrogen doping concentration that is higher than that of the second ILD layer in the MRAM cell array area.

22. The method according to claim 14, wherein the capping layer comprises a nitrogen-doped silicon carbide (NDC) layer.

23. The method according to claim 14, wherein the protective layer comprises a silicon nitride layer.

* * * * *